United States Patent [19]

Kromer et al.

[11] Patent Number: 5,412,663
[45] Date of Patent: May 2, 1995

[54] APPARATUS FOR SYNCHRONIZING ASYNCHRONOUS CIRCUITS FOR TESTING OPERATIONS

[75] Inventors: Stephen C. Kromer; Gopi Ganapathy, both of Austin, Tex.

[73] Assignee: Advanced Micro Devices, Inc., Sunnyvale, Calif.

[21] Appl. No.: 110,053

[22] Filed: Aug. 20, 1993

[51] Int. Cl.⁶ .................... H04B 17/00; G06F 13/00
[52] U.S. Cl. .................... 371/22.1; 371/22.5; 364/271; 364/271.2; 364/271.4
[58] Field of Search ............ 371/15.1, 22.2, 22.3, 371/22.4, 22.5, 22.6, 25.1, 42; 307/269; 340/825.14, 825.2; 324/73.1, 158 R; 364/271.2, 569, 271, 271.4

[56] References Cited

U.S. PATENT DOCUMENTS

| | | | |
|---|---|---|---|
| 4,139,147 | 2/1979 | Franke | 371/25.1 |
| 4,229,699 | 10/1980 | Frissell | 307/269 X |
| 4,970,405 | 11/1990 | Hagiwara | 307/269 |
| 5,099,140 | 3/1992 | Mudgett | 307/269 |
| 5,166,604 | 11/1992 | Ahanin et al. | 371/22.3 X |
| 5,227,672 | 7/1993 | Sawtell | 307/269 |
| 5,252,917 | 10/1993 | Kadowaki | 371/22.3 X |
| 5,289,050 | 2/1994 | Ogasawara | 307/269 |
| 5,289,116 | 2/1994 | Kurita et al. | 371/15.1 X |

*Primary Examiner*—Emanuel T. Voeltz
*Assistant Examiner*—M. Kemper
*Attorney, Agent, or Firm*—Foley & Lardner

[57] ABSTRACT

An apparatus for synchronizing a plurality of asynchronous circuits during testing operations is provided. The apparatus includes first and second clock inputs, a test mode input, and an output. The apparatus receives a first clock signal from a first clock at the first clock input, and a second clock signal from a second clock at the second clock input. Responsive to the state of a test mode signal at the test mode input, the apparatus generates either the first clock signal or the second clock signal at the output. A first circuit is arranged to be driven by the output of the apparatus, while a second circuit is driven by one of the first or second clocks. Consequently, the first and second circuits are driven by different clocks when the test mode signal is in one state, and driven by the same clock when the test mode signal is in another state. Because the first and second circuits are driven by the same clock during testing operations, the timing of the communications between the circuits is predictable, making it possible to perform certain testing techniques that are not possible when the timing of inter-circuit communication is not predictable.

21 Claims, 2 Drawing Sheets

APPARATUS FOR SYNCHRONIZING ASYNCHRONOUS CIRCUITS FOR TESTING OPERATIONS

BACKGROUND OF THE INVENTION

The present invention relates to an apparatus for synchronizing a plurality of circuits, and more specifically for synchronizing a plurality of asynchronous circuits during testing operations.

In many computer systems, not all circuits are driven by the same clock. Computer systems comprising circuits driven by different clocks are referred to herein as asynchronous systems, and intrasystem data transfers between circuits which are driven by different clocks are asynchronous. The asynchronous nature of intercircuit communications between circuits within a computer system which are driven by different clocks makes accurate testing of such asynchronous systems difficult.

Specifically, a testing operation generally comprises the steps of monitoring actual outputs of a tested circuit at predetermined times and comparing those actual outputs of the tested circuit with predetermined correct outputs. The tested circuit is considered faulty if the actual outputs do not substantially match the predetermined correct outputs. For such a testing operation to work, one must be able to predict exactly when a valid (non-faulty) circuit will produce particular outputs.

However, the time that an asynchronous system will produce a given output may vary since the timing of data transfers within the system between a circuit driven by one clock and a circuit driven by another clock may vary. The variance in the timing of such data transfers may result from, for example, a variance in testing temperature. A change in testing temperature may affect the transfer timing between different circuits in different ways, depending on the direction and magnitude of the temperature change and the internal characteristics of the circuits involved.

Another reason for such variance in timing of data transfers is that such transfers are often effected upon the coincidence of particular timing, or clock, signals in two asynchronous circuits; the required coincidence of two independent clock signals cannot be predicted with sufficient accuracy to sufficiently accurately compare actual outputs with predetermined outputs to reliably test a computer system.

That is, if, during testing, the outputs of an asynchronous system are checked at the wrong times, then a valid asynchronous system may fail a testing operation, or a faulty asynchronous system may pass a testing operation. Testing becomes even more difficult when the separately-clocked circuits of an asynchronous system reside on a single integrated circuit chip, since there is generally no convenient way to directly monitor a chip's internal data transfers.

Further, certain testing techniques, such as scan-testing and burn-in testing, are rendered difficult and inefficient when the circuit to be tested contains separately-clocked regions. Scan-testing consists of shifting data directly into a specific component of a system configured as an integrated circuit, clocking the circuit to shift data from a first component through a series of other components, and then shifting the data out of the system. The data shifted out is then compared to predicted output data. If the data shifted out does not substantially match the predicted output data, then the integrated circuit is considered faulty.

Paths within an integrated circuit which couple the series of components through which data is shifted during scan-testing are called scan paths. When an integrated circuit does not comprise a plurality of separately-clocked circuits, a relatively simple set of instructions can be used to perform data loading and data shifting required by the scan-testing process. However, in asynchronous systems the boundary between separately-clocked components effectively becomes a barrier to scan paths. This is because one cannot reliably predict whether data will be transferred between asynchronous components during any particular clock cycle.

Consequently, each respective asynchronous circuit or region, within a tested system must be scan-tested separately. As a result, each asynchronous circuit requires its own set of instructions for loading and shifting data, and such instruction sets are typically more complex than they would be for the loading and testing of data within a synchronous system where respective intrasystem circuits are driven by the same clock. In addition, the testing is less comprehensive in such asynchronous systems where respective asynchronous circuits are scan-tested separately, since each separately-clocked circuit is tested in isolation, rather than being tested in conjunction with other circuits with which a respective tested circuit normally operates.

During burn-in testing, a system to be tested is placed in a high-temperature environment and selected signals are applied to the system while the system is clocked. By thus "exercising" the components of the system at a high temperature, any marginal components in the system are forced to fail. Burn-in testing for asynchronous systems is difficult, since a plurality of clock signals must be applied to the tested system to effectively "exercise" the system. In addition, the propagation of signals within even a valid chip is unpredictable, since such signals must cross the asynchronous boundaries between the separately-clocked circuits on components.

An attempt has been made to accurately predict the generation of outputs in an asynchronous system by allowing a tester to phase shift or "skew" the signal of one of the clocks in the tested system. The signal of one clock is skewed in order to "tune" the output timing to the timing of the test mechanism which monitors the outputs. The altered timing of the skewed clock signal will alter the timing of the asynchronous data transfers between the circuit driven by the skewed clock signal and the other circuits in the tested system. The altered timing of the asynchronous data transfers will, in turn, alter the timing of the outputs generated by the asynchronous system. Under the assumption that a successful test operation will only result when the output generation is accurately synchronized with output monitoring, the skew of the clock signal is adjusted until the asynchronous system tests valid.

This signal-skewing technique has the disadvantage that, even when the tested system is valid, the skewing process is relatively time consuming. Further, if the tested system is faulty, then the tester may waste time trying to skew the clock signal timing to achieve a valid test result when such a result is impossible. Further, the signal-skewing technique does not overcome the problems involved in scan testing or burn-in testing an asynchronous system, as described above.

As is evident from the foregoing, it is clearly desirable to provide an apparatus that allows asynchronous systems to be accurately tested without a preliminary clock tuning process. It is further desirable to provide an apparatus that allows asynchronous systems to be accurately tested more quickly than is currently possible using the clock signal skewing process of the prior art. It is further desirable to provide an apparatus that allows asynchronous systems to be accurately scan tested. Finally, it is desirable to provide an apparatus that allows asynchronous systems to be accurately burn-in tested.

SUMMARY OF THE INVENTION

According to one aspect of the present invention, a clock selection circuit for use with a first clock generating a first clock signal, a second clock generating a second clock signal, a first circuit configured to be driven by a clock signal applied at a first circuit clock input and a second circuit operatively connected with the second clock, for synchronizing the first circuit with the second circuit in response to a test mode signal, is provided. The second circuit is driven by the second clock signal and is operatively connected for asynchronous communication with the first circuit.

The clock selection circuit generally includes a first clock input operatively connected with the first clock for receiving the first clock signal, a second clock input operatively connected with the second clock for receiving the second clock signal, a test mode input for receiving the test mode signal. The clock selection circuit further includes a clock output operatively connected with first circuit clock input.

The clock selection circuit synchronizes the first circuit with the second circuit during testing operations by applying the first clock signal to the first circuit clock input through the clock output when the test mode signal is in a first predetermined state, and applying the second clock signal to the first circuit clock input through the clock output when the test mode signal is in a second predetermined state.

According to another aspect of the present invention, an integrated circuit is provided. The integrated circuit includes a first circuit configured to be driven by a clock signal applied at a first clock input, and a second circuit operatively connected for asynchronous communication with the first circuit. The second circuit is configured to be driven by a clock signal applied at a second clock input.

The integrated circuit further includes a test mode input for receiving a test mode signal, and a clock selection circuit operatively connected with a first clock signal source generating a first clock signal, a second clock signal source generating a second clock signal, the test mode input, and the first clock input.

The second clock input is coupled to the second clock signal source, thereby causing the second circuit to be driven by the second clock signal regardless of the state of the test mode signal. The clock selection circuit applies the first clock signal to the first clock input when the test mode signal is at a first predetermined state, and applies the second clock signal to the first clock input when the test mode signal is at a second predetermined state.

BRIEF DESCRIPTION OF THE DRAWINGS

The features of the present invention, which are believed to be novel, are set forth with particularity in the appended claims. The invention, together with further objects and advantages thereof, may best be understood by making reference to the following description taken in conjunction with the accompanying drawings, in the several figures of which like reference numerals identify like elements, and wherein:

DETAILED DESCRIPTION OF THE PREFERRED EMBODIMENT

Figure 1:
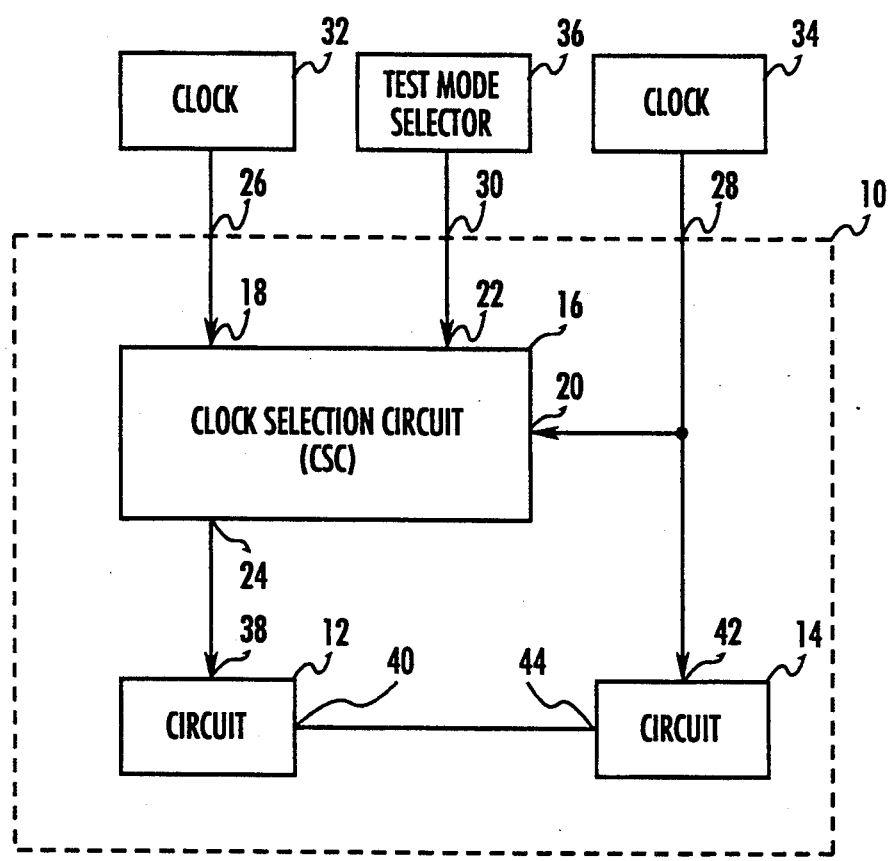
FIG. 1 illustrates in block diagram form an asynchronous system employing a representative embodiment of the present invention.

FIG. 1 illustrates in block diagram form an asynchronous system 10 employing the present invention. System 10 includes a plurality of circuits 12 and 14, a clock selection circuit ("CSC") 16, a plurality of clock signal inputs 26 and 28, and a test mode input 30.

Clock signal input 26 is connected with a clock 32, and clock signal input 28 is connected with a clock 34. Circuit 12 may be, for example, a circuit for controlling a peripheral device in a computer system, while clock 32 is a clock signal generator associated with the peripheral device. Similarly, circuit 14 may be a processor device in a computer system, while clock 34 may be a clock signal generator for driving the processor device. In the preferred embodiment of the present invention, circuit 12, circuit 14, and clock selection circuit 16 all reside on a single integrated circuit chip.

Test mode input 30 is connected with a test mode selector 36. Clock selection circuit 16 includes a first CSC clock input 18, a second CSC clock input 20, a CSC test mode input 22, and a CSC clock output 24. CSC clock input 18 is connected with clock signal input 26, and CSC clock input 20 is connected with clock signal input 28. CSC test mode input 22 is connected with test mode input 30.

Circuit 12 includes a circuit-driving clock input 38 and a communications port 40. Circuit 12 is driven by clock pulses applied at circuit-driving clock input 38, which is connected with CSC clock output 24. Circuit 14 includes a circuit-driving clock input 42 and a communication port 44. Circuit 14 is driven by clock pulses applied at circuit-driving clock input 42, which is connected with clock signal input 28. Communication port 40 of circuit 12 is connected with communication port 44 of circuit 14.

Test mode selector 36 transmits a test mode signal to clock selection circuit 16 through test mode input 30 and CSC test mode input 22. The state of the test mode signal indicates whether system 10 is currently being tested or is being operationally employed. For example, the test mode signal may be a logical HIGH when system 10 is operationally employed and is being tested, and a logical LOW when system 10 is not being tested.

Clock 32 transmits a clock signal through clock signal input 26 and CSC clock input 18 to clock selection circuit 16. Clock 34 transmits a different clock signal through clock signal input 28 to CSC clock input 20 and circuit-driving clock input 42.

When the test mode signal at CSC test mode input 22 indicates that system 10 is not being tested, clock selection circuit 16 generates at CSC clock output 24 the clock signal received at CSC clock input 18. Conversely, when the test mode signal at CSC test mode input 22 indicates that system 10 is being tested, clock selection circuit 16 generates at CSC clock output 24 the clock signal received at CSC clock input 20.

Thus configured, circuit 14 will be driven by the clock signal from clock 34 regardless of the state of test mode signal generated by test mode selector 36; circuit 12 is driven by the clock signal from clock 32 when the test mode signal indicates that system 10 is not being tested, and by the clock signal from clock 34 when the test mode signal indicates that system 10 is being tested.

Consequently, during non-testing operation, circuit 12 is driven by a first clock signal, circuit 14 is driven by a second clock signal, and any communication which occurs between circuit 12 and circuit 14 through communication ports 40 and 44 is asynchronous. During a testing operation, both circuit 12 and circuit 14 are driven by the clock signal generated by clock 34. Since both circuits 12 and 14 are driven by the same clock, communications between circuits 12 and 14 becomes synchronized, or synchronous. As a result, the timing of the data transfers between circuit 12 and circuit 14 becomes predictable. Since the timing of the data transfers between circuits 12 and 14 is predictable, the timing of the outputs of system 10 are predictable. In effect, system 10 transformed into a synchronous circuit for the purposes of testing, thus avoiding all of the predictability problems discussed above with respect to testing asynchronous systems.

Figure 2:
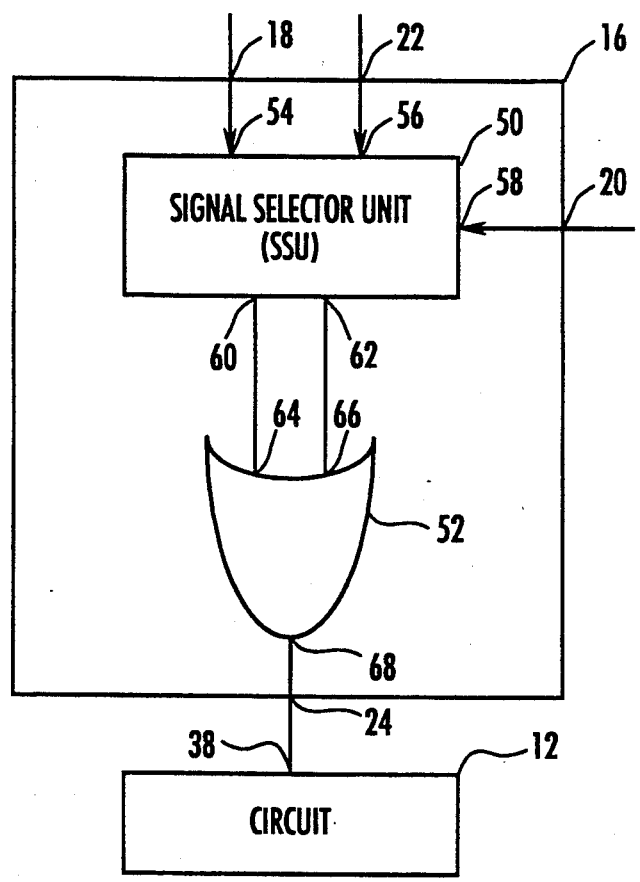
FIG. 2 illustrates in block diagram form a representative embodiment of the clock selector circuit of FIG. 1 in greater detail.

FIG. 2 illustrates in block diagram form the clock selection circuit 16 of FIG. 1 in greater detail. clock selection circuit 16 includes a signal selector unit ("SSU") 50 and an OR gate 52. Signal selector unit 50 has a plurality of SSU clock signal inputs 54 and 58, a plurality of SSU clock signal outputs 60 and 62, and a test signal input 56. SSU clock signal input 54 is connected with CSC clock input 18, and SSU clock signal input 58 is connected with CSC clock input 20. Test signal input 56 is connected with CSC test mode input 22.

OR gate 52 has a plurality of inputs 64 and 66, and an output 68. Input 64 is connected with SSU clock signal output 60, and input 66 is connected with SSU clock signal output 62. Output 68 is connected with CSC clock output 24.

Thus configured, signal selector unit 50 receives the test mode signal at test input 56, receives the clock signal from clock 32 at SSU clock signal input 54, and receives the clock signal from clock 34 at SSU clock signal input 58. When the test mode signal at test input 56 indicates that system 10 is not being tested, signal selector unit 50 allows the clock signal at SSU clock signal input 54 to pass through to SSU clock signal output 60, and drives SSU clock signal output 62 to a logical LOW. OR gate 52 receives the signal at SSU clock signal output 60 at input 64 and the signal at SSU clock signal output 62 at input 66. Since the signal generated at SSU clock signal output 62 is LOW, the output of OR gate 52 will mirror the signal applied at input 64. Specifically, OR gate 52 will generate, at output 68, a logical HIGH when the clock signal applied at SSU clock signal input 54 is HIGH, and a logical LOW when the clock signal applied at SSU clock signal input 54 is LOW.

Consequently, when the test mode signal indicates that system 10 is not being tested, the signal at output 68 mirrors the signal at SSU clock signal input 54. Since the signal at SSU clock signal input 54 is generated by clock 32, and circuit 12 is driven, through circuit-driving clock input 38, by the signal at output 68, the timing of circuit 12 is determined by clock 32. In contrast, the timing of circuit 14 is determined by clock 34, which generates a clock signal to drive circuit 14 through circuit-driving clock input 42.

Thus, when the test mode signal indicates that system 10 is not being tested, circuit 12 is being driven by a different clock than circuit 14. Because circuits 12 and 14 are being driven by different clocks, the communication between circuits 12 and 14 is asynchronous. That is, all data sent between circuits 12 and 14 via ports 40 and 44 are sent in sync with one clock, but received in sync with another clock. As mentioned above, the asynchronous nature of these communications renders accurate prediction of the receipt of transmitted data, which prediction is essential to perform certain testing techniques, extremely difficult.

When the test mode signal indicates that system 10 is being tested, signal selector unit 50 allows the clock signal at SSU clock signal input 58 to pass through to SSU clock signal output 62, and drives SSU clock signal output 60 to a logical LOW. OR gate 52 receives the LOW signal generated at SSU clock signal output 60 at input 64 and the clock signal at SSU clock signal output 62 at input 66. Since the signal generated at SSU clock signal output 60 is LOW, the output of OR gate 52 will mirror the signal applied at input 66. Specifically, OR gate 52 will generate, at output 68, a logical HIGH when the clock signal applied at SSU clock signal input 58 is HIGH, and a logical LOW when the clock signal applied at SSU clock signal input 58 is LOW.

Consequently, when the test mode signal indicates that system 10 is being tested, the signal at output 68 mirrors the signal at SSU clock signal input 58. Since the signal at SSU clock signal input 58 is generated by clock 34, and circuit 12 is driven, through circuit-driving clock input 38, by the signal at output 68, the timing of circuit 12 is determined by clock 34. As discussed above, the timing of circuit 14 is also determined by clock 34.

Thus, when the test mode signal indicates that system 10 is being tested, circuit 12 is being driven by the same clock as circuit 14. Because circuits 12 and 14 are being driven by same clock, the communication between circuits 12 and 14 is synchronous. That is, all data sent between circuits 12 and 14 via ports 40 and 44 are sent and received in sync with the same clock. As a result, the receipt of data transmitted between circuit 12 and 14 may be accurately predicted, allowing system 10 to be tested using testing techniques that would not otherwise be possible.

Figure 3:
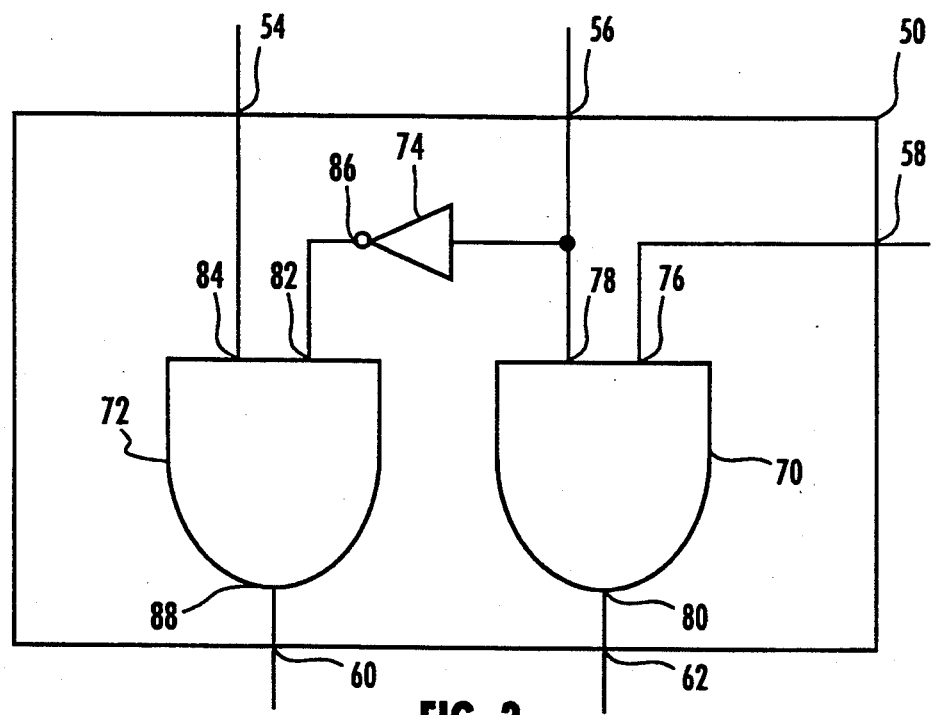
FIG. 3 illustrates in block diagram form a representative embodiment of the signal selector unit of FIG. 2 in greater detail.

FIG. 3 is a block diagram illustrating the preferred embodiment of signal selector unit 50 of FIG. 2 in greater detail. Signal selector unit 50 preferably includes a plurality of AND gates 70 and 72 and an inverter 74. AND gate 70 has a plurality of inputs 76 and 78 and an output 80. Input 76 is connected with SSU clock signal input 58, and input 78 is connected with input 56. Output 80 is connected with SSU clock signal output 62.

AND gate 72 includes a plurality of inputs 82 and 84 and an output 88. Input 82 is connected to an output 86 of inverter 74, and input 84 is connected with SSU clock signal input 54. Output 88 is connected with SSU clock signal output 60.

Thus configured, when the test mode signal at input 56 is HIGH, the signal at input 78 will be HIGH and the signal at input 82 will be LOW. Because input 82 is LOW, output 88 of AND gate 72 will be LOW, regardless of the signal applied at input 84 through SSU clock signal input 54. On the other hand, because input 78 is HIGH, output 80 of AND gate 70 will mirror the signal at SSU clock signal input 58, as it is applied to input 76.

When the test mode signal at input 56 is LOW, the signal at input 82 will be HIGH and the signal at input 78 will be LOW. Because the signal at input 78 is LOW, the output 80 of AND gate 70 is LOW, regardless of the signal applied at input 76 through SSU clock signal input 58. On the other hand, because input 82 is HIGH, output 88 of AND gate 72 will mirror the signal at SSU clock signal input 54, as it is applied to input 84.

Consequently, when the test mode signal is LOW, output 88 mirrors the signal at SSU clock signal input 54, and output 80 is LOW. Conversely, when the test mode signal is HIGH, output 80 mirrors the signal at SSU clock signal input 58, and output 88 is LOW. Since the signals at outputs 88 and 80 are sent to OR gate 52, OR gate 52 generates at output 68 the signal at SSU clock signal input 54 when the test mode signal is LOW, and the signal at SSU clock signal input 58 when the test mode signal is HIGH. Further, because the signal at SSU clock signal input 54 and the signal at SSU clock signal input 58 are generated by clocks 32 and 34, respectively, output 68 will generate the clock signal of clock 32 when the test mode signal is LOW, and generate the clock signal of clock 34 when the test mode signal is HIGH.

It is to be understood that the detailed drawings and specific examples given describe preferred embodiments of the invention and are for the purpose of illustration, that the apparatus of the invention is not limited to the precise details and conditions disclosed, and that various changes may be made therein without departing from the spirit of the invention which is defined by the following claims:

What is claimed is:

1. A clock selection circuit, for use in a computer system including a first circuit and a second circuit, for synchronizing said first circuit with said second circuit in response to a test mode signal, said computer system including a first clock generating a first clock signal and a second clock generating a second clock signal, the clock selection circuit comprising:
   a first clock input connected with said first clock for receiving said first clock signal;
   a second clock input connected with said second clock for receiving said second clock signal;
   a test mode input for receiving said test mode signal; and
   a clock output connected with an input to said first circuit;
   the clock selection circuit driving said first circuit with said first clock signal through said clock output when said test mode signal is in a first predetermined state, and driving said first circuit with said second clock signal through said clock output when said test mode signal is in a second predetermined state, said second circuit being driven by said second clock signal regardless of the state of said test mode signal, said first circuit and said second circuit operating synchronously in response to said second clock signal when said test mode signal is in said second predetermined state.

2. A clock selection circuit, for use in a computer system including a first circuit and a second circuit, for synchronizing said first circuit with said second circuit in response to a test mode signal, as recited in claim 1, wherein said clock output is connected with said first clock input, said second clock input, and said test mode input through logic means, said logic means being configured to generate at said clock output a signal logically related to signals at said first clock input, said second clock input, and said test mode input.

3. A clock selection circuit, for use in a computer system including a first circuit and a second circuit, for synchronizing said first circuit with said second circuit in response to a test mode signal, as recited in claim 2, wherein said logic means comprises a signal selector unit connected with said first clock input, said second clock input and said test mode input, said signal selector unit having a first signal selector unit output and a second signal selector unit output.

4. A clock selection circuit, for use in a computer system including a first circuit and a second circuit, for synchronizing said first circuit with said second circuit in response to a test mode signal, as recited in claim 3, wherein said signal selector unit electrically couples said first clock input with said first signal selector unit output and drives said second signal selector unit output LOW when said test mode signal is in said first predetermined state, and said signal selector unit electrically couples said second clock input with said second signal selector unit output and drives said first signal selector unit output LOW when said test mode signal is in said second predetermined state.

5. A clock selection circuit, for use in a computer system including a first circuit and a second circuit, for synchronizing said first circuit with said second circuit in response to a test mode signal, as recited in claim 4, wherein said logic means further comprises a logic circuit connected with said first signal selector unit output, said second signal selector unit output and said clock output, for generating at said clock output a signal logically related to signals at said first signal selector unit output and said second signal selector unit output.

6. A clock selection circuit, for use in a computer system including a first circuit and a second circuit, for synchronizing said first circuit with said second circuit in response to a test mode signal, as recited in claim 5, wherein said logic circuit comprises an OR gate having a first OR input electrically connected with said first signal selector unit output, a second OR input electrically connected with said second signal selector unit output, and an OR output electrically connected with said clock output.

7. A clock selection circuit, for use in a computer system including a first circuit and a second circuit, for synchronizing said first circuit with said second circuit in response to a test mode signal, as recited in claim 5, wherein said signal selector unit comprises:
   a first AND gate having a first AND1 input, a second AND1 input and an AND1 output, said first AND1 input being connected with said first clock input, said AND1 output being connected with said first signal selector unit output;
   a second AND gate having a first AND2 input, a second AND2 input and an AND2 output, said first AND2 input being connected with said second clock input and said second AND2 input being connected with said test mode input, said AND2 output being connected with said second signal selector unit output; and an inverter having an inverter input and an inverter output, said inverter input being connected with said test mode input and said inverter output being connected with said second AND1 input.

8. A clock selection circuit, for use in a computer system including a first circuit and a second circuit, for synchronizing said first circuit with said second circuit in response to a test mode signal, as recited in claim 3, wherein said logic means further comprises a logic circuit connected with said first signal selector unit output, said second signal selector unit output and said clock output, for generating at said clock output a signal logically related to signals at said first signal selector unit output and said second signal selector unit output.

9. A clock selection circuit, for use in a computer system including a first circuit and a second circuit, for synchronizing said first circuit with said second circuit in response to a test mode signal, as recited in claim 8, wherein said logic circuit comprises an OR gate having a first OR input electrically connected with said first signal selector unit output, a second OR input electrically connected with said second signal selector unit output, and an OR output electrically connected with said clock output.

10. A clock selection circuit, for use in a computer system including a first circuit and a second circuit, for synchronizing said first circuit with said second circuit in response to a test mode signal, as recited in claim 1, wherein the clock selection circuit resides with said first circuit and said second circuit on a single integrated circuit chip.

11. An integrated circuit comprising:
a first circuit having a first circuit clock input and a first communications port, said first circuit being configured to be driven at said first clock input;
a second circuit having a second communications port connected with said first communications port, said second circuit having a second circuit clock input, said second circuit being configured to be driven at said second circuit clock input; and
a clock selection circuit, including
a test mode input for receiving a test mode signal,
a first clock signal input for receiving a first clock signal from a first clock signal source,
a second clock signal input for receiving a second clock signal from a second clock signal source, and
a clock output;
said second circuit clock input being connected with said second clock signal input through said second clock output, said second circuit being driven by said second clock signal;
said clock selection circuit being connected with said first circuit clock input through said clock output, said clock selection circuit applying said first clock signal to said first circuit clock input when said test mode signal is at a first predetermined state, said first circuit and said second circuit operating asynchronously in response to said first clock signal and said second clock signal when said test mode signal is at said first predetermined state, said clock selection circuit applying said second clock signal to said first circuit clock input when said test mode signal is at a second predetermined state, said first circuit and said second circuit operating synchronously in response to said second clock signal when said test mode signal is at said second predetermined state.

12. An integrated circuit as recited in claim 11, wherein said clock selection circuit further includes a logic means, said clock output being connected with said first clock input, said second clock input, and said test mode input through said logic means, said logic means being configured to generate at said clock output a signal logically related to signals at said first clock input, said second clock input, and said test mode input.

13. An integrated circuit as recited in claim 12, wherein said logic means comprises a signal selector unit connected with said first clock input, said second clock input and said test mode input, said signal selector unit having a first signal selector unit output and a second signal selector unit output.

14. An integrated circuit as recited in claim 13, wherein said signal selector unit electrically couples said first clock input with said first signal selector unit output and drives said second signal selector unit output LOW when said test mode signal is in said first predetermined state, and said signal selector unit electrically couples said second clock input with said second signal selector unit output and drives said first signal selector unit output LOW when said test mode signal is in said second predetermined state.

15. An integrated circuit as recited in claim 14, wherein said signal selector unit comprises:
a first AND gate having a first AND1 input, a second AND1 input and an AND1 output, said first AND1 input being connected with said first clock input, said AND1 output being connected with said first signal selector unit output;
a second AND gate having a first AND2 input, a second AND2 input and an AND2 output, said first AND2 input being connected with said second clock input and said second AND2 input being connected with said test mode input, said AND2 output being connected with said second signal selector unit output; and
an inverter having an inverter input and an inverter output, said inverter input being connected with said test mode input and said inverter output being connected with said second AND1 input.

16. An integrated circuit as recited in claim 15, wherein said logic means further comprises a logic circuit connected with said first signal selector unit output, said second signal selector unit output, and said clock output, for generating at said clock output a signal logically related to signals at said first signal selector unit output and said second signal selector unit output.

17. An integrated circuit as recited in claim 16, wherein said logic circuit comprises an OR gate having a first OR input electrically connected with said first signal selector unit output, a second OR input electrically connected with said second signal selector unit output, and an OR output electrically connected with said clock output.

18. An integrated circuit as recited in claim 13, wherein said logic means further comprises a logic circuit connected with said first signal selector unit output, said second signal selector unit output and said clock output, for generating at said clock output a signal logically related to signals at said first signal selector unit output and said second signal selector unit output.

19. An integrated circuit as recited in claim 18, wherein said logic circuit comprises an OR gate having a first OR input electrically connected with said first signal selector unit output, a second OR input electrically connected with said second signal selector unit output, and an OR output electrically connected with said clock output.

20. An integrated circuit as recited in claim 11, wherein the clock selection circuit resides with said first circuit and said second circuit on a single integrated circuit chip.

21. An integrated circuit as recited in claim 11 wherein said first circuit comprises a peripheral device controller and said second circuit comprises a processor.

* * * * *